United States Patent
Lee et al.

(10) Patent No.: US 7,330,602 B2
(45) Date of Patent: Feb. 12, 2008

(54) VARIABLE DENSITY SIGNAL SAMPLING

(75) Inventors: Jin Hung Lee, Menlo Park, CA (US);
Brad Osgood, Stanford, CA (US);
Dwight G. Nishimura, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 560 days.

(21) Appl. No.: 10/944,381

(22) Filed: Sep. 17, 2004

(65) Prior Publication Data

US 2006/0062486 A1    Mar. 23, 2006

(51) Int. Cl.
*G06K 9/64* (2006.01)
(52) U.S. Cl. .................. 382/278; 382/276; 382/284
(58) Field of Classification Search ................ 382/284, 382/276, 278, 280, 275, 272, 264, 108; 358/453, 358/463; 702/127, 191, 193, 194; 700/44, 700/40, 42, 45; 370/431, 329; 342/378; 375/346; 455/562.1
See application file for complete search history.

(56) References Cited

U.S. PATENT DOCUMENTS

| | | | |
|---|---|---|---|
| 6,240,098 B1 * | 5/2001 | Thibault et al. | 370/431 |
| 6,314,327 B1 * | 11/2001 | Mugler et al. | 700/44 |
| 6,567,567 B1 | 5/2003 | Levin et al. | 382/284 |
| 6,990,252 B2 * | 1/2006 | Shekter | 382/276 |

OTHER PUBLICATIONS

Jin Hyung Lee, Dwight G. Nishimura, Brad Osgood: "*Optimal Variable-Density k-Space Sampling in MRI*," ISBI 2004: 237-240.
Jin Hyung Lee, Dwight G. Nishimura, Brad Osgood: "*Optimal Variable-Density Sampling and Interpolation*," Stanford University, CA, unpublished paper, unknown date.

\* cited by examiner

*Primary Examiner*—Anh Hong Do
(74) *Attorney, Agent, or Firm*—Beyer Weaver LLP

(57) ABSTRACT

An optimal sampling pattern for variable density sampling of a continuous signal uses a statistical knowledge of the signal to determine an autocorrelation matrix from which a basis set is identified. Sampling is performed at locations determined from an eigenvector matrix, and the sampled output provides coefficients for the basis set. The reconstructed signal output is a summation of the multiplication of the coefficients and the basis set.

13 Claims, 4 Drawing Sheets

VARIABLE DENSITY SIGNAL SAMPLING

GOVERNMENT RIGHTS

The U.S. Government has rights in the disclosed invention pursuant to NIH Grant Nos. NIH-HL39297 AND HL-75803 to Stanford University.

BACKGROUND OF THE INVENTION

This invention relates generally to signal sampling techniques, and more particularly the invention relates to variable density signal sampling. The invention is applicable to the sampling of any signal but has particular applicability to magnetic resonance imaging (MRI) signals. The invention will be described in context of MRI signals and applications, but is not limited thereto.

Assuming that a signal is band-limited, uniform sampling at the Nyquist rate is typically employed. However, to reduce the sampling rate below the Nyquist rate, prior knowledge of the signal is advantageous in establishing optimal sampling locations.

In MRI, a continuous signal is sampled at arbitrary locations chosen by design. However, each sample in MRI is very costly since only one sample can be acquired at a time. To obtain a higher resolution, or a bigger field-of-view image, more samples need to be collected, but longer scan time results in problems such as motion and flow artifacts. Furthermore, in cases where the physiological parameter of interest has a shorter time constant compared to the scan time required for the given resolution and field-of-view, it is necessary to reduce the number of sampling points beyond the limit imposed by the Nyquist sampling rate.

To reduce the number of sample points, many different techniques utilizing prior knowledge of the signal have been proposed and used. These techniques are mainly based on the observation that the low spatial frequency components have bigger energy. Therefore, these techniques mostly try sampling more densely in the low spatial frequency region while under-sampling in the high spatial frequency region. These techniques are generally known to work well. Yet the problem of determining the optimal sampling pattern has not been solved heretofore.

SUMMARY OF THE INVENTION

The present invention provides a method of optimal sampling pattern determination for variable density signal sampling. The method is based on a statistical knowledge of the signal of interest. The invention determines the optimal sampling points as a subset of a pre-determined dense grid which has a sampling rate high enough to resolve the signal of interest. The reconstruction interpolates the signal to find all the data points on the pre-determined dense grid.

The invention includes a training stage and a signal sampling and reconstruction stage. At the training stage, the statistical information of the data is extracted, and the optimal sampling locations are determined along with the optimal reconstruction associated with the sampling. A block diagram of the training stage is shown in FIG. 1. The statistical knowledge is first extracted from a set of signals that are previously sampled onto a dense enough grid with sampling rate higher than the Nyquist sampling rate. From the training set the autocorrelation matrix is estimated. If the autocorrelation of the signal is analytically known, this step can be avoided. Then, by eigenvalue decomposition of the autocorrelation matrix, the orthogonal basis set can be found. If the signal of interest has correlation among samples so that the number of inherently independent components (d) is less than the dimension of the signal (N), there will be eigenvalues that are zero. Only the orthogonal vectors that correspond to the nonzero eigenvalues comprise the orthogonal basis set for the signal of interest.

Once the orthogonal basis set is found, the problem is reduced to finding the coefficients of the orthogonal basis from a certain number of samples. If the sampling can be done in the linear transform domain where there are only d nonzero components which are the coefficients of the basis, only d samples would be needed since the N dimensional signal can be recovered from the d coefficients through a linear transformation. However, the sampling has to be performed in the given domain. Therefore, it has to be decided which samples need to be taken in a given domain to best estimate the coefficients of the orthogonal basis. This can be done by using the linear relationship between the samples and the coefficients.

The problem of finding the best set of sample locations based on this linear relationship is a well known, difficult combinatorial problem. However, there are many different heuristic approaches to this problem which work well in practice, referred to as an experiment design problem in convex optimization. Using a convex optimization routine, optimal sampling points can be determined. Depending on the condition number of the matrix defining the relationship between the coefficients and the samples, the number of samples required to accurately resolve the coefficients (k) can be different but the number is usually close to the number of coefficients.

Once the training is done, sampling and the reconstruction can be done as shown in FIG. 2. Sampling can be done at the sample locations that have been determined in the training stage, resulting in a k dimensional signal. The reconstruction of the signal can then be done by finding the coefficients of the orthogonal basis. Once the coefficients are found the reconstruction is a simple linear combination of the orthogonal basis using the coefficients.

The invention and objects and features thereof will be more readily apparent from the following detailed description and appended claims when taken with the drawings.

DETAILED DESCRIPTION

Figure 1:
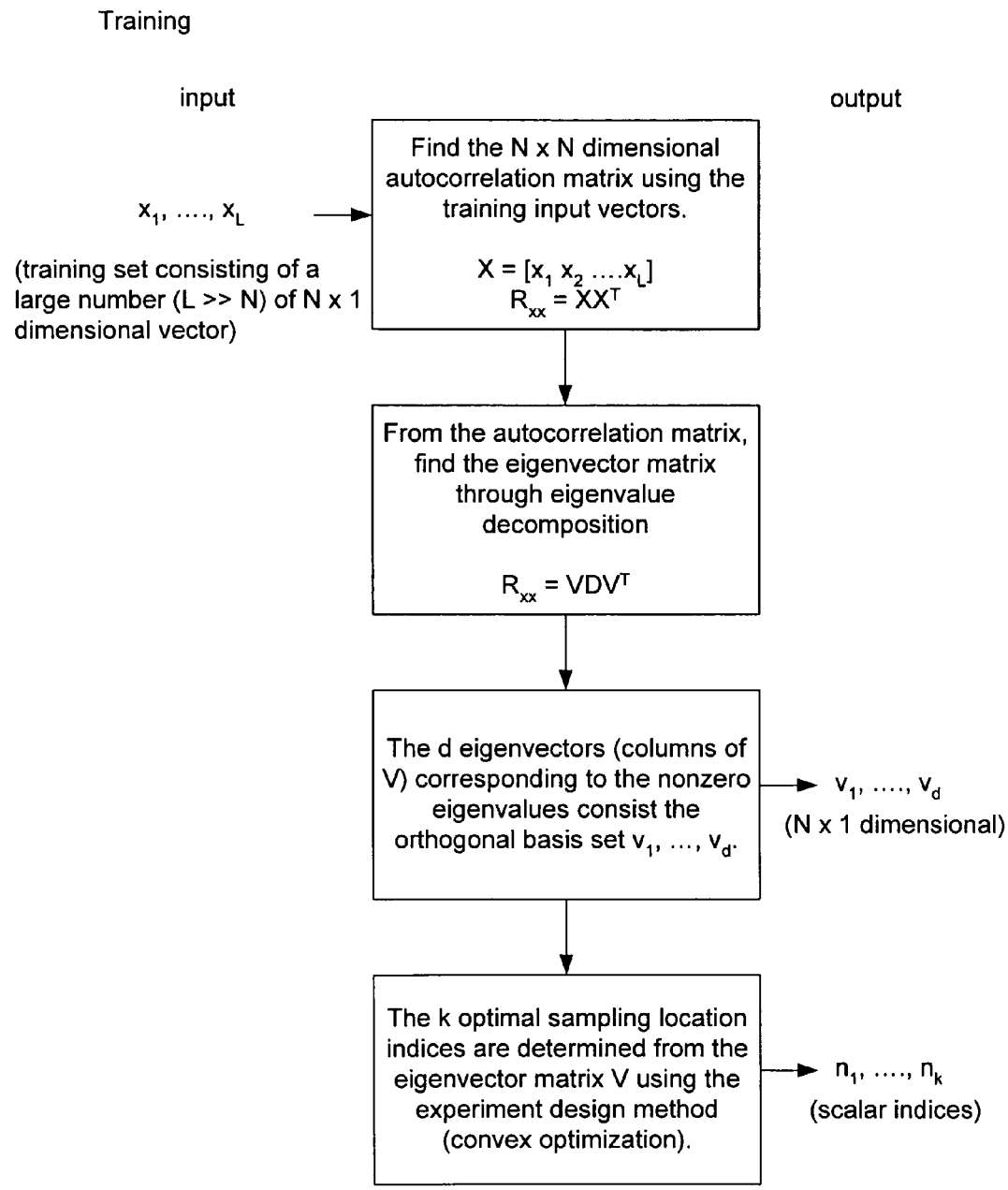
FIG. 1 is a function block diagram of the training stage of the sampling pattern determination in accordance with the invention.
Figure 2:
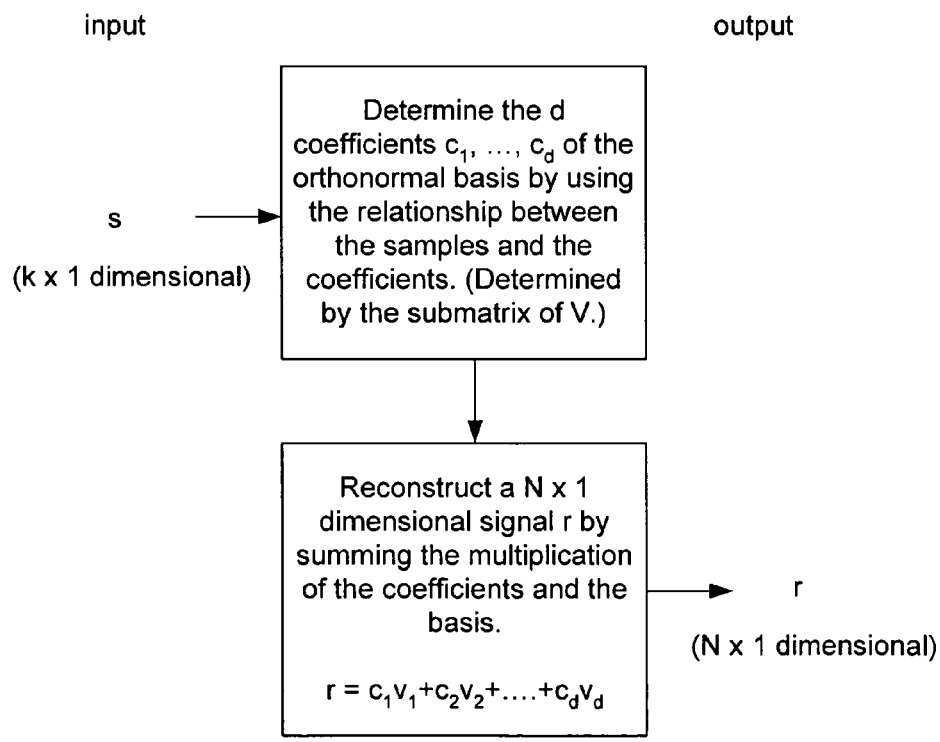
FIG. 2 is a functional block diagram of the signal sampling and reconstruction stage of the invention.

The invention will now be described for a MRI application. In MRI, signals for reconstructing an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins. The detected signals can be envisioned as traversing lines in a Fourier transformed space (k-space) with the lines aligned in spaced parallel Cartesian trajectories and in spiral trajectories emanating from an origin in k-space.

The sampling of k-space comes at a cost of time, and long scan times come with many disadvantages such as motion artifacts. Furthermore, in some imaging applications where the time constant of the physiological parameter of interest is shorter than the imaging time, MRI is not feasible. There have been many different approaches to reducing the number of sample points. Many of these approaches are based on the observation that the low frequency components of a signal are more important. Following is a description of a general method for selecting a limited number of sample points, with the optimal interpolation kernel associated with the sampling pattern. The demonstration of the method is done on phantom and in-vivo data as a proof of concept. The algorithm can be applied to guide optimal variable-density trajectory design or reduced phase encoding in 3DFT and spectroscopy.

Under the sole assumption that the signal is band-limited, the best thing to do is uniform sampling at the Nyquist sampling rate. However, to reduce the sampling rate below the Nyquist rate without introducing significant degradation, it is necessary to introduce prior knowledge of the signal to select sample points and reconstruct the signal optimally.

In the present invention, the prior knowledge of the signal is used to determine an orthogonal basis of the signal. The optimal sampling points are then determined by finding the best estimate of the coefficients of the orthogonal basis.

The orthogonal basis of the signal of interest can be found from the autocorrelation matrix of the signal. Since the autocorrelation is a statistical parameter, it has to be estimated from an ensemble of the signal. If we let X be a matrix with the member of the ensemble of the data as its columns, $$X = [x_1 x_2 \ldots x_L] \quad (1)$$

the autocorrelation matrix can be calculated as follows (assuming zero mean):

$$R_X = XX^T \quad (2)$$

Here, L is the number of representatives taken from the ensemble for the estimation of the autocorrelation matrix. L has to be significantly larger than the dimension of the signal N (L>>N). The eigenvalue decomposition of the autocorrelation matrix can then be used to find the orthogonal basis. If we write $$R_x = VDV^T = \sum_{i=1}^{N} \mu_i v_i v_i^T \quad (3)$$

then the eigenvectors $v_i$ that corresponds to nonzero eigenvalues $\mu_i$ comprise an orthogonal basis. In most signals of interest the number of orthogonal basis vectors for the signal (d) will be far less than the dimension of the signal (N). The inherent dimensionality of the signal is then d.

The signal can be expressed as a linear combination of the basis vectors. Therefore, it can be completely described by the corresponding d coefficients of the basis vectors. However, the values of the signal as given, from which we draw the sample values, are from the original measurements in k-space and are not matched to the space spanned by the orthogonal basis determined in the first step. Finding the best set of samples that determine the coefficients of the orthogonal basis, that then specify the signal, becomes a difficult combinatorial problem. Fortunately, the problem can be relaxed into a convex problem that can be solved using a convex optimization routine. See Boyd et al., *Convex Optimization*, Cambridge University Press, 2004. The solution provides a good heuristic answer to our problem. The convex optimization problem was formulated as follows:

$$\text{Maximize } det\left(\sum_{i=1}^{N} \lambda_i u_i u_i^T\right) \quad (4)$$

Subject to $0 \leq \lambda_i \leq 1$ $$\sum_{i=1}^{N} \lambda_i = d$$

Where, $\mu_i$ are vectors consisting of the ith components of the basis vectors. Therefore, they are d dimensional vectors. The inputs to this routine are the basis vectors, which will determine the vectors $\mu_i$, and the desired number of samples, d. The output is a vector $\lambda = [\lambda_1 \ldots \lambda_n]$ which gives a heuristic as to how important each sample is in determining the coefficients of the orthogonal basis; each $\lambda_1$ corresponds to a sample point. The reason why the values of $\lambda_1$ are not simply 0 or 1 comes from the relaxation into a convex optimization problem. We then simply threshold this to $\lambda$ determine whether to take the sample. Once the coefficients of the basis are found, the linear combination of the basis vectors provides the interpolation.

Experiments were conducted using a GE 1.5 T whole-body scanner with a maximum gradient amplitude of 40 mT/m and maximum slew rate of 150 mT/m/ms.

Ideally, when characterizing the signal to find the optimal sampling point and the optimal interpolation kernel, an ensemble of the random process is required. For the demonstration of the concept, simple experiments were done on phantom and in-vivo data.

We demonstrate the method by using a simple one dimensional data that has some statistical correlation. To emulate this situation, we used a ball phantom data from a 3D projection reconstruction trajectory. The trajectory had 100 readout points with 31,744 projection angles. Since 31,744>>100, it provides enough data from the ensemble that can be used for the estimation of the autocorrelation matrix. Furthermore, the radial symmetry of the ball will provide apparent statistical correlation of the signal while, the nonzero phase of the data and other MR related imperfections provide the variations in the data. To make sure the signal we estimate is not included in the statistical estimation process, only half of the projection (which is still much bigger than the dimension of the signal, 15,872>>100) was used for the estimation. Then, the algorithm was used to reconstruct a signal from a projection angle that was not included in the statistical analysis.

The same experiment was performed on an in-vivo knee data set. The different projections of the knee may not necessarily have significant statistical correlation. The purpose of this experiment was to demonstrate that even in signals without much apparent statistical correlation, the method can be used to reduce the sampling. Following the same procedure for the phantom, all the projection angles were reconstructed and then the 3D image was reconstructed.

For both experiments, reconstruction from fully sampled data, as well as from non-optimal sub-sampled data was performed for comparison. The non-optimal sub-sampling points were chosen from the center of k-space with the same number of samples as the optimal case.

Figure 3:
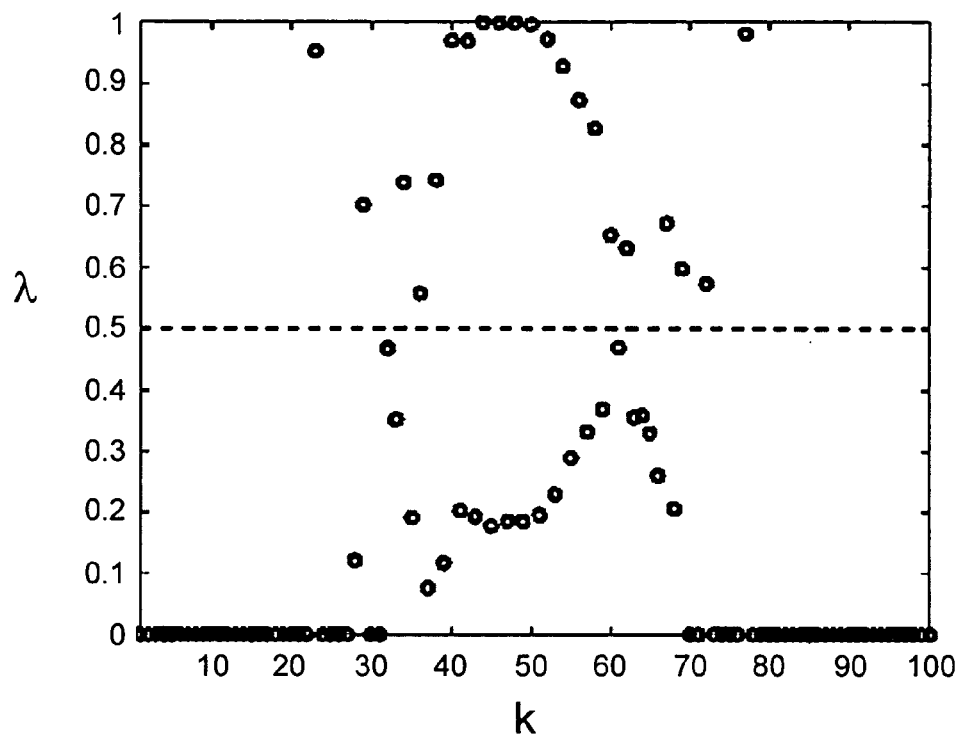
FIG. 3 is a graph of output vectors, $\lambda$, versus k-space readout points and illustrates sampling points in k-space.
Figure 4:
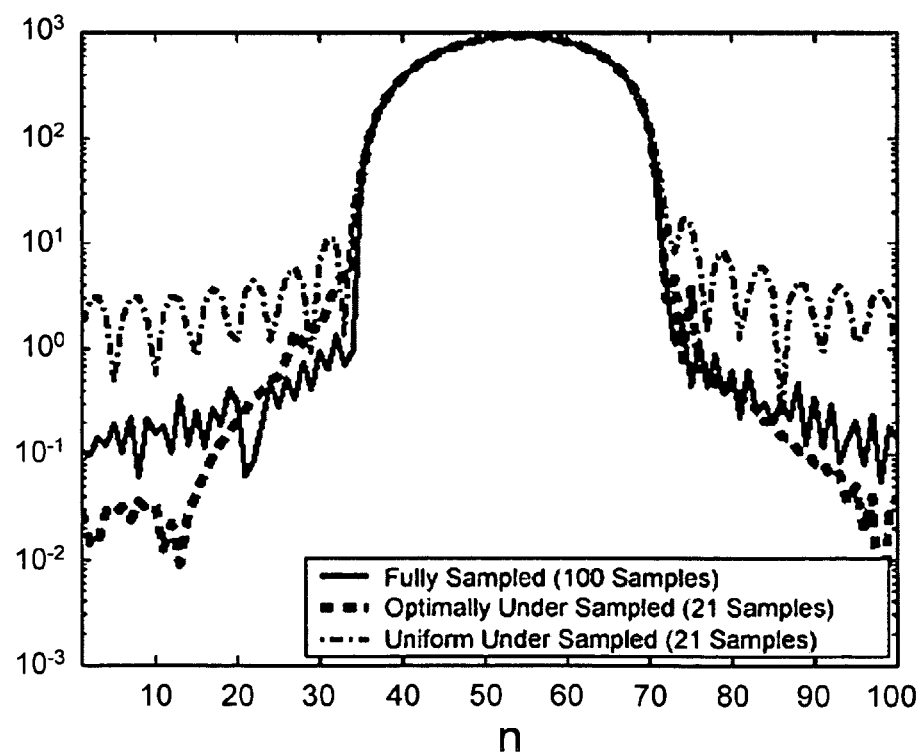
FIG. 4 is a graph of signal intensity versus position for the reconstruction of a ball phantom projection using a full 100 samples, using 10 optimally selected signal samples in accordance with the invention, and using 10 signal samples at the center of k-space.

FIG. 3 shows the λ parameter chosen by the optimization routine. This value represents the importance of the corresponding point in k-space. When 0.5 is chosen as the threshold, 21 irregularly spaced sample points are selected as indicated by the points above the threshold. The reconstructions using three different methods are compared in FIG. 4. The solid line is the reconstruction from the full 100 samples. The bold-dashed line shows the reconstruction from 21 optimally selected sampling points. The dashed-dotted line shows the reconstruction from 21 uniform samples chosen from the center of k-space. The optimal sampling and reconstruction clearly shows improvement over uniform under-sampling and close to the fully sampled case with one fifth of the sample points. Finding the optimal sampling point took less than 10 sec in MATLAB with instant reconstruction.

Figure 5A:
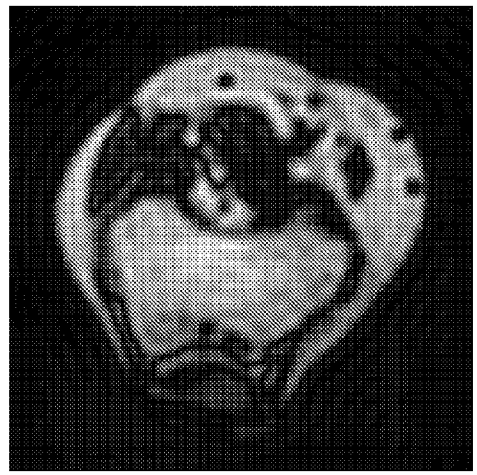
FIGS. 5a-5c are axial images from a 3D reconstruction of a knee using full sampling (5a), using data at the central k-space region (5b), and using optimal sampling in accordance with the invention (5c).
Figure 5B:
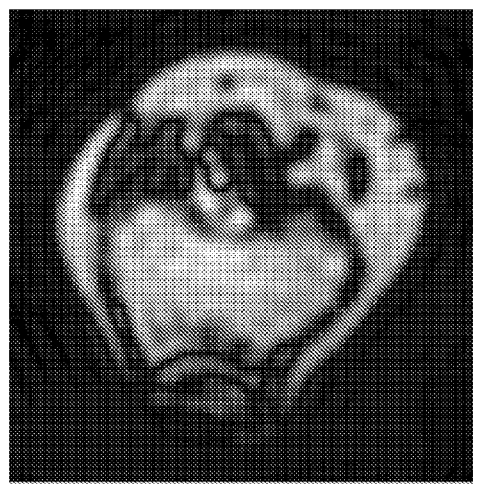
Figure 5C:
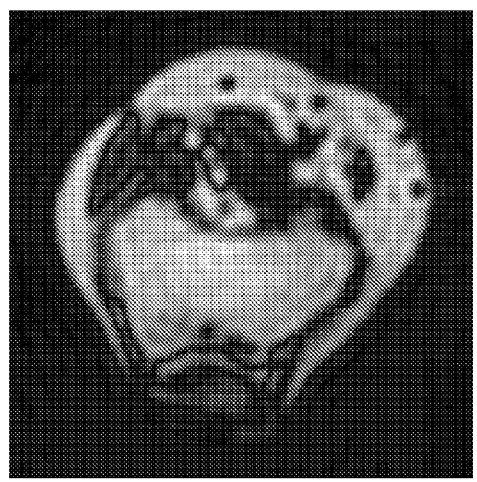

The reconstructions of the knee from the three methods are shown in FIG. 5, with (5a) being from full sampling, (5b) being from data at the central k-space region, and (5c) being from optimal sampling. Compared to the full reconstruction from all 100 samples along the projection, the reconstruction with just 74 samples at the center of k-space appears more blurred. The reconstruction from the optimal 74 sampling points shows comparable sharpness as the reconstruction from the full 100 samples. It should be noted that reducing the number of sample points along the readout direction does not save scan time in 3DPR. The experiment is a demonstration for the feasibility of the method to reduce the number of samples in general. For selecting 74 samples out of a 100, the optimal sampling point selection algorithm took approximately 30 sec in MATLAB. Since the reconstruction is just a linear combination, it is done in an instant.

The advantage of the invention lies in characterizing the optimal sampling points that need to be selected in order to obtain the best reconstruction. The practical difficulties may include characterizing the statistical parameters of the signal of interest. Since the statistical parameter needs to be set only once for a given protocol, it is beneficial in cases where scan time is a highly limiting factor. This invention can be utilized as guidance to design trajectories with optimal sampling. For example, it can be used to determine the optimal radial sampling locations of variable-density spiral trajectories. It can also be used for 3DFT, spectroscopic imaging to determine optimal phase encoding locations, and optimal trajectory design for real time imaging. It is also useful for adaptive imaging that will enable better motion tracking in real time imaging.

However, the invention is not limited to MRI applications, but can be used in signal sampling in many other applications. Thus, while the invention has been described with reference to specific applications, the description is illustrative of the invention but is not limiting the invention. Various applications may occur to those skilled in the art without departing from the spirit and scope of the invention as defined by the appended claims.

What is claimed is:

1. A method of optimally sampling a continuous signal comprising the steps of:
   (a) identifying a basis set from an eigenvector matrix of an autocorrelation matrix from previously sampled sets of data,
   (b) identifying optimal sampling locations from the eigenvector matrix,
   (c) sampling an input signal at the optimal sampling locations,
   (d) determining coefficients for the basis set from the sampled input signal, and
   (e) summing the multiplication of coefficients and the basis set to construct the sampled signal.

2. The method of claim 1 wherein in step (b) convex optimization is used in identifying the optimal sampling locations.

3. The method of claim 1 wherein in step (a) the previously sampled sets of data, $x_1, \ldots x_L$, is a large number (L>>N) of a N×1 dimensional vector and the autocorrelation matrix is $Rxx=XX^T$ where $X=[x_1, x_2 \ldots x_L]$.

4. The method of claim 3 wherein the basis set $v_1, \ldots v_d$ is d eigenvectors corresponding to nonzero eigenvalues of the autocorrelation matrix.

5. The method of claim 4 wherein convex optimization is used for identifying optimal sample locations in step (b).

6. The method of claim 3 wherein convex optimization is used for identifying optimal sample locations in step (b).

7. The method of claim 1 wherein the continuous signal comprises a magnetic resonance imaging signal.

8. The method of claim 7 wherein in the step (b) the optimal sampling locations are identified in k-space.

9. A method of sampling an analog signal for use in digital processing of the signal comprising the steps of:
   (a) finding an autocorrelation matrix using previously sampled sets of signal,
   (b) finding an eigenvector matrix through eigenvector decomposition of the autocorrelation matrix,
   (c) identifying an orthogonal basis set from the eigenvector matrix,
   (d) identifying optimal sampling locations from the eigenvector matrix,
   (e) sampling an analog signal at the identified optimal sampling locations,
   (f) determining coefficients of the orthogonal basis set using the relationship between the samples and the coefficients as determined by the submatrix of eigenvectors, and
   (g) summing the multiplication of the coefficients and the orthogonal basis to construct a sampled signal.

10. The method of claim 9 wherein the analog signal is a magnetic resonance imaging signal.

11. The method of claim 10 wherein in step (d) convex optimization is used in identifying the optimal sampling locations.

12. The method of claim 11 wherein in step (d) the optimal sampling locations are identified in k-space.

13. The method of claim 9 wherein in step (d) convex optimization is used in identifying the optimal sampling locations.

* * * * *